(12) United States Patent
Baars et al.

(10) Patent No.: US 10,056,369 B1
(45) Date of Patent: Aug. 21, 2018

(54) SEMICONDUCTOR DEVICE INCLUDING BURIED CAPACITIVE STRUCTURES AND A METHOD OF FORMING THE SAME

(71) Applicant: GLOBALFOUNDRIES Inc., Grand Cayman (KY)

(72) Inventors: Peter Baars, Dresden (DE); Frank Jakubowski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/890,452

(22) Filed: Feb. 7, 2018

Related U.S. Application Data

(62) Division of application No. 15/439,444, filed on Feb. 22, 2017, now Pat. No. 9,929,148.

(51) Int. Cl.
| | |
|---|---|
| H01L 21/00 | (2006.01) |
| H01L 27/06 | (2006.01) |
| H01L 21/321 | (2006.01) |
| H01L 21/3213 | (2006.01) |
| H01L 21/84 | (2006.01) |
| H01L 21/762 | (2006.01) |
| H01L 49/02 | (2006.01) |
| H01L 29/49 | (2006.01) |
| H01L 23/31 | (2006.01) |
| H01L 29/417 | (2006.01) |
| H01L 23/535 | (2006.01) |
| H01L 29/06 | (2006.01) |
| H01L 27/12 | (2006.01) |
| H01L 27/108 | (2006.01) |

(52) U.S. Cl.
CPC .... *H01L 27/0629* (2013.01); *H01L 21/32115* (2013.01); *H01L 21/32133* (2013.01); *H01L 21/76283* (2013.01); *H01L 21/84* (2013.01); *H01L 23/3178* (2013.01); *H01L 23/535* (2013.01); *H01L 28/60* (2013.01); *H01L 29/0649* (2013.01); *H01L 29/41783* (2013.01); *H01L 29/495* (2013.01); *H01L 29/4916* (2013.01); *H01L 27/108* (2013.01); *H01L 27/1203* (2013.01)

(58) Field of Classification Search
CPC .... H01L 27/108; H01L 27/1203; H01L 21/84
See application file for complete search history.

(56) References Cited

U.S. PATENT DOCUMENTS

| | | | |
|---|---|---|---|
| 8,048,736 B2 * | 11/2011 | Werner | H01L 28/40 257/211 |
| 8,420,479 B2 * | 4/2013 | Chumakov | H01L 21/76865 257/296 |

(Continued)

*Primary Examiner* — Nicholas Tobergte
(74) *Attorney, Agent, or Firm* — Amerson Law Firm, PLLC

(57) ABSTRACT

A method includes forming a plurality of openings extending through a semiconductor layer, through a buried insulating layer, and into a substrate material in a second device region of a semiconductor device while covering a first device region of the semiconductor device. An insulating material is formed on sidewalls and on a bottom face of each of the plurality of openings, and a first capacitor electrode is formed in each of the plurality of openings in the presence of the insulating material, wherein each of the first capacitor electrodes includes a conductive material and partially fills a respective one of the plurality of openings.

19 Claims, 9 Drawing Sheets

(56) References Cited

U.S. PATENT DOCUMENTS

| | | | |
|---|---|---|---|
| 8,946,019 B2 * | 2/2015 | Chumakov | H01L 23/5223 |
| | | | 257/E21.09 |
| 9,761,580 B1 | 9/2017 | Ramaswamy | |
| 9,929,148 B1 * | 3/2018 | Baars | H01L 27/0629 |
| 2012/0068239 A1 | 3/2012 | Kim | |
| 2017/0317108 A1 | 11/2017 | Hoentschel et al. | |

* cited by examiner

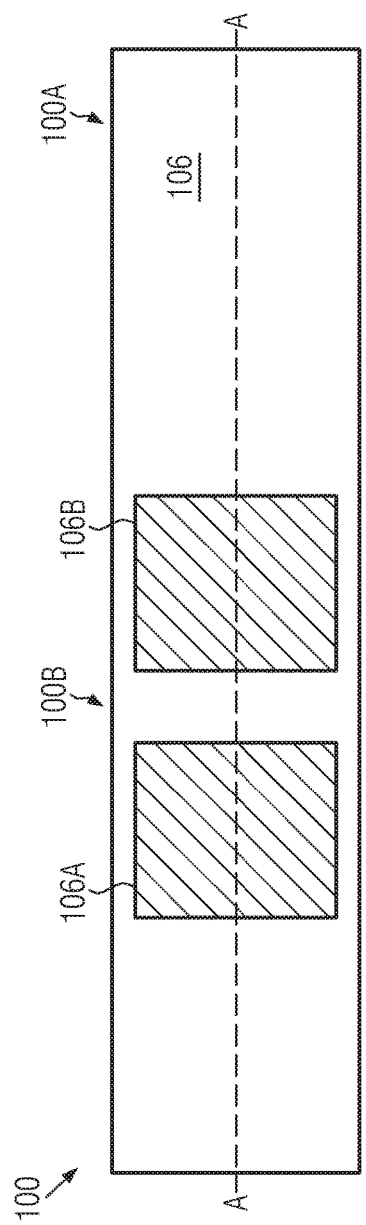
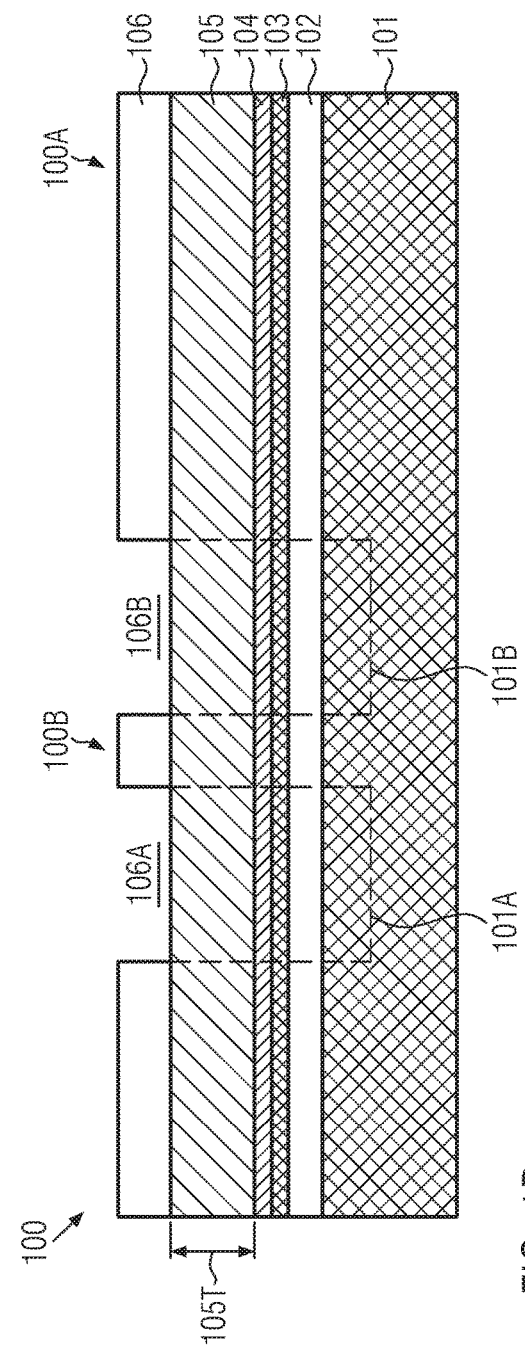
FIG. 1A
FIG. 1B

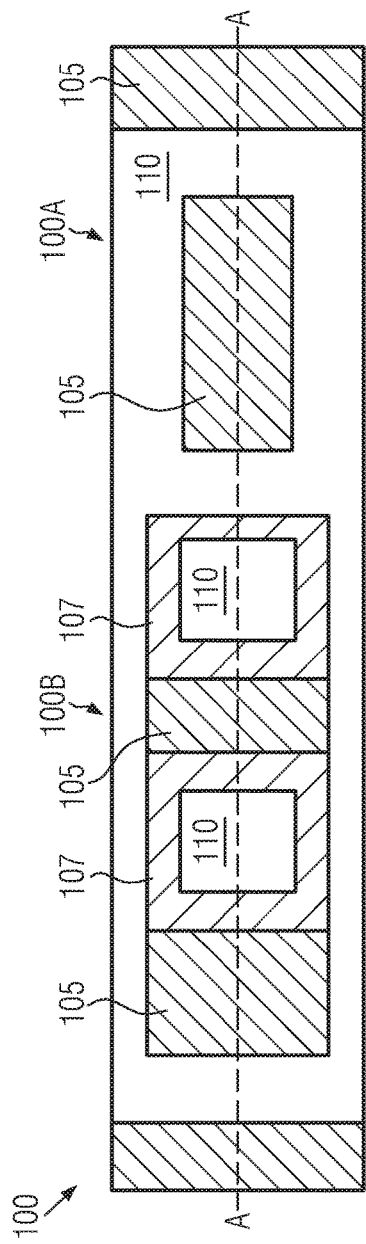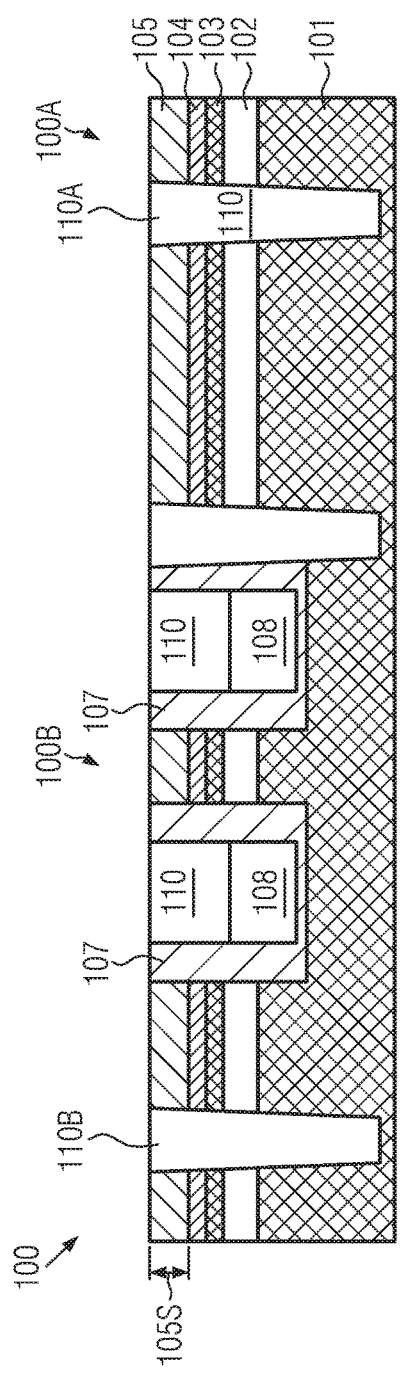
FIG. 6A
FIG. 6B

SEMICONDUCTOR DEVICE INCLUDING BURIED CAPACITIVE STRUCTURES AND A METHOD OF FORMING THE SAME

BACKGROUND

1. Field of the Disclosure

Generally, the present disclosure relates to semiconductor devices, in which capacitive structures have to be provided in addition to active circuit elements, such as transistors and the like, in order to obtain superior device performance and/or extending device functionality, for instance, with respect to RF applications and the like.

2. Description of the Related Art

Continuous progress has been made in the semiconductor industry, thereby now providing integrated circuits having incorporated therein a very large number of circuit elements, such as transistors and the like. In addition to the transistor elements, which are typically provided in the form of digital and/or analog components for controlling voltage and/or currents within the semiconductor device, there is a continuous tendency for integrating additional functionality into a single semiconductor device, thereby forming even complete systems on a single chip—System On Chip (SoC). As a consequence, passive circuit elements, in particular capacitors and the like, have to be implemented in many types of integrated circuits in addition to the typically used resistors.

For example, many manufacturing strategies have been developed for incorporating capacitive structures into the design of complex integrated circuits, for instance for providing decoupling capacitors, intended for stabilizing the operation of critical device areas, for instance, by buffering the operating voltage, when fast switching transistor elements may cause moderately high transient currents. To this end, semiconductor-based capacitive structures, for instance having one electrode in the active semiconductor material, may be provided at strategically appropriate locations in the semiconductor device so as to reduce supply voltage fluctuations. In other cases, a plurality of capacitors has to be incorporated in order to realize storage areas, such as dynamic RAM areas. In these storage areas, a bit of information is typically stored by using one capacitor and an associated transistor, wherein, in view of achieving a high bit density, the capacitors may typically be provided as deep trench capacitors so as to establish the required capacitance, thereby, however, requiring additional complex process steps for forming a deep trench and appropriately filling the deep trench with the conductive and dielectric materials.

When providing capacitive structures in the device level of a semiconductor device, i.e., in and on the semiconductor material, which is also used for forming the active circuit elements, such as sophisticated transistors for logic areas in silicon-based integrated circuits relying, for instance, on the well-established CMOS technique, these structures are preferably implemented as components having a configuration similar to preferably NMOS transistors, thereby, however, consuming valuable substrate space, which may therefore significantly restrict the design flexibility with respect to reducing the overall dimensions of complex integrated circuits. Furthermore, providing respective capacitive structures in the device level of a complex semiconductor device may require an appropriate design adaptation with respect to the contact level and in particular the overall signal routing in the metallization system of the semiconductor device, since the device level internal signal routing capabilities are significantly affected by the additional capacitive structures formed therein.

In many other approaches, capacitive structures are provided within the metallization system of complex semiconductor devices, thereby providing the possibility of incorporating highly conductive metal materials in the capacitor electrodes, while substantially avoiding space consumption in the device level. On the other hand, the incorporation of metal-based capacitors in the metallization system requires a complex redesign of the respective signal routing in the metallization level and may finally also contribute to an overall increase of the lateral size of a complex integrated circuit, since the area in the metallization system occupied by the capacitors is no longer available for signal routing. Moreover, the incorporation of the capacitors in the metallization system may require significant additional process steps upon forming a complex metallization system, thereby also significantly contributing to overall process complexity and thus increased manufacturing costs.

Since, in addition to the general quest for reducing overall power consumption while still maintaining high performance of integrated circuits, there is also an increasing demand for implementing passive circuit areas of increased functionality, for instance by incorporating RF components, which in turn may impart superior connectivity functionality to an integrated circuit. Due to this general development in the semiconductor industry and despite the difficulties in forming capacitive structures as pointed out above, capacitors have to be increasingly incorporated into the design of integrated circuits, wherein, in particular, existing technologies may not be considered promising options due to the moderately high complexity and/or space consumption, which significantly contributes to overall manufacturing costs.

In view of the situation described above, the present disclosure therefore relates to techniques in which capacitive structures may be provided in integrated circuits while avoiding or at least reducing the effects of one or more of the problems identified above.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is based on the concept that capacitive structures may be efficiently implemented in semiconductor devices formed on the basis of semiconductor-on-insulator (SOI) techniques, in which typically a buried insulating layer separates a semiconductor layer from a semiconductor-based substrate material. This SOI device configuration may be efficiently used for providing a "buried" capacitive structure, without requiring, however, the formation of deep trenches. The buried capacitive structures may have a shared capacitor electrode in the form of a respective portion of the substrate material, while highly conductive electrodes, such as metal-containing or doped semiconductor-containing electrodes, may be positioned above the substrate material. Due to the buried nature of the capacitive structures, the device level, i.e., the area typically provided above a respective semiconductor layer, may nevertheless be efficiently used for signal routing and the like, as the area above the buried capacitive structures may still be available for forming conductive lines, such as electrode lines, thereon. Therefore, capacitors for various purposes may be provided in a highly space-efficient manner as a buried structure in a specific device region of a semiconductor device, wherein a high degree of compatibility with existing process flows for manufacturing SOI-based semiconductor devices is preserved. That is, by incorporating the capacitive structures at the level of the buried insulating layer, non-complex process techniques may be applied, thereby providing a low-cost overall manufacturing flow, while still maintaining signal routing capabilities above the buried capacitive structures in the device level, the contact level and the metallization system.

In one illustrative embodiment, a method is disclosed that includes, among other things, forming a plurality of openings extending through a semiconductor layer, through a buried insulating layer, and into a substrate material in a second device region of a semiconductor device while covering a first device region of the semiconductor device. The illustrative method further includes forming an insulating material on sidewalls and on a bottom face of each of the plurality of openings, and forming a first capacitor electrode in each of the plurality of openings in the presence of the insulating material, wherein each of the first capacitor electrodes includes a conductive material and partially fills a respective one of the plurality of openings.

In yet another exemplary embodiment of the present disclosure, a method includes forming a plurality of openings extending through a semiconductor layer, through a buried insulating layer, and into a substrate material in a second device region of a semiconductor device while covering a first device region of the semiconductor device, and forming an insulating material in each of the plurality of openings, wherein the insulating material covers sidewalls and a bottom face of each of the plurality of openings. Furthermore, the disclosed method also includes forming a first capacitor electrode of a conductive material in each of the plurality of openings, wherein the insulating material separates the first capacitor electrodes from the sidewalls and the bottom faces of the plurality of openings, and wherein a height level of a top surface of each of the first capacitor electrodes is positioned at or below a height level of a bottom face of the semiconductor layer. Additionally, the illustrative method further includes forming an electrical connection to a second capacitor electrode formed in a portion of the substrate material in the second device region below each of the first capacitor electrodes, wherein the second capacitor electrode is a shared capacitor electrode of each of the first capacitor electrodes.

BRIEF DESCRIPTION OF THE DRAWINGS

The disclosure may be understood by reference to the following description taken in conjunction with the accompanying drawings, in which like reference numerals identify like elements, and in which:

FIGS. 1A and 1B schematically illustrate a top view and a cross-sectional view, respectively, of a semiconductor device in an initial manufacturing stage for forming capacitive structures in one device region at the level of a buried insulating layer, according to illustrative embodiments;

FIGS. 6A and 6B schematically illustrate a top view and a cross-sectional view, respectively, of the semiconductor device in a manufacturing stage, in which the isolation structures are filled with insulating material, according to illustrative embodiments;

Figure 2A:
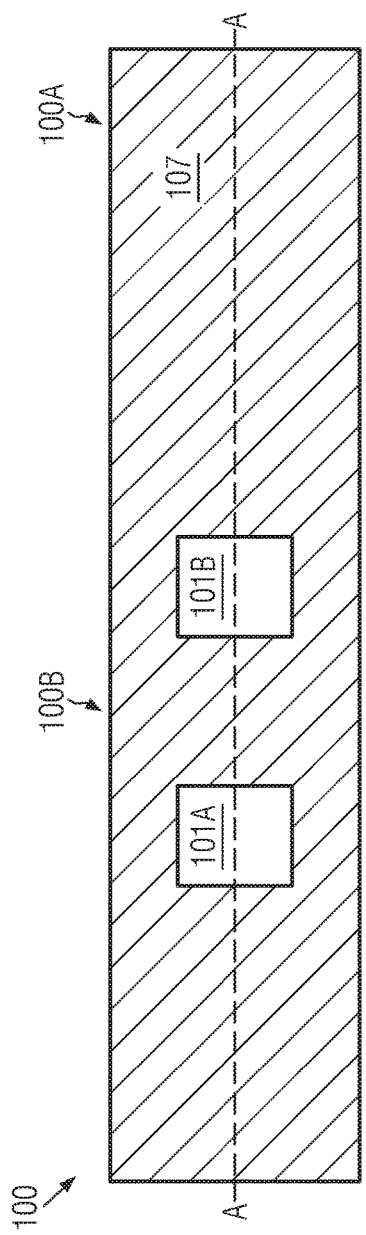
FIGS. 2A and 2B schematically illustrate a top view and a cross-sectional view, respectively, of the semiconductor device in a further advanced manufacturing stage with respective openings formed so as to extend into the substrate material for accommodating respective metal-containing electrodes of capacitive structures, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the subject matter defined by the appended claims to the particular forms disclosed, but on the contrary, the intention is to cover all modifications, equivalents, and alternatives falling within the spirit and scope of the claimed subject matter.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used in this description and in the appended claims, the terms "substantial" or "substantially" are intended to conform to the ordinary dictionary definition of that term, meaning "largely but not wholly that which is specified." As such, no geometrical or mathematical precision is intended by the use of terms such as "substantially flat," "substantially perpendicular," "substantially parallel," "substantially circular," "substantially elliptical," "substantially rectangular," "substantially square," "substantially aligned," and/or "substantially flush," and the like. Instead, the terms "substantial" or "substantially" are used in the sense that the described or claimed component or surface configuration, position, or orientation is intended to be manufactured, positioned, or oriented in such a configuration as a target. For example, the terms "substantial" or "substantially" should be interpreted to include components and surfaces that are manufactured, positioned, or oriented as close as is reasonably and customarily practicable within normally accepted tolerances for components of the type that are described and/or claimed. Furthermore, the use of phrases such as "substantially conform" or "substantially conforms" when describing the configuration or shape of a particular component or surface, such as by stating that "the configuration of the component substantially conforms to the configuration of a rectangular prism," should be interpreted in similar fashion.

Furthermore, it should be understood that, unless otherwise specifically indicated, any relative positional or directional terms that may be used in the descriptions set forth below—such as "upper," "lower," "above," "below," "over," "under," "top," "bottom," "vertical," "horizontal," "lateral," and the like—have been included so as to provide additional clarity to the description, and should be construed in light of that term's normal and everyday meaning relative to the depiction of the components or elements in the referenced figures. For example, referring to the cross-sectional view of the in-process device depicted in FIG. 1B, it should be understood that the semiconductor layer 103 is depicted as being positioned "above" the buried insulating material 102, and the buried insulating material layer 102 is depicted as being positioned "between" the semiconductor layer 103 and the base substrate material 101. Additionally, the "top" or "upper" surface of the semiconductor layer 103 as shown in FIG. 1B is depicted as being substantially "horizontally" oriented, the bottom face 101L of the openings 101A, 101B are depicted in FIG. 2B as being positioned "below" the bottom surface of the buried insulating layer 102, and the trench isolation structures 110B are shown as extending into the substrate material 101 to a point "below" the "bottom" or "lower" surfaces of the capacitor electrodes 108.

Illustrative embodiments of the present disclosure are based on the concept that capacitive structures of a semiconductor device may be positioned at the level of a buried insulating layer, i.e., the lowest depth level of the respective capacitive structures may be substantially restricted to a position in the vicinity of a buried insulating layer of an SOI (semiconductor-on-insulator) configuration, wherein a portion of the semiconductor material or substrate material at a height level of a bottom face of the buried insulating layer may act as a shared capacitor electrode for a plurality of buried capacitive structures. On the other hand, the other capacitor electrode may be provided above the shared capacitor electrode and separated therefrom by an appropriate insulating material such that the "upper" capacitor electrodes are provided so as to have a height level that is below a height level of the semiconductor layer of the SOI configuration. That is, the present disclosure relies on the concept that efficient capacitive structures, for instance to be used as buffer capacitors, decoupling capacitors, storage capacitors and the like, may be provided at a depth level that is basically determined by the depth of the buried insulating layer. Thus, the term "at the level of the buried insulating layer" is to be understood such that the capacitor dielectric material may be positioned at a height level that may correspond to a height level defined by a distance of several ten nanometers to several hundred nanometers with respect to the bottom face of the buried insulating layer. In this manner, a buried configuration is obtained, wherein, due to the reduced depth level of the capacitive structure, a significantly reduced complexity in forming respective openings for accommodating the "upper" capacitor electrodes therein may be achieved compared to the formation of deep trenches of capacitors as are typically used in dynamic RAM devices and the like.

On the other hand, the buried nature of the capacitive structures may still allow a high degree of design flexibility with respect to signal routing in the device level, i.e., the gate level, of the semiconductor device, since the space of the device region above the buried capacitive structures is still available for providing, for instance, conductive lines, such as electrode lines formed together with gate electrodes. Moreover, by using a shared capacitor electrode in the form of the substrate material, the contacting of the capacitive structures may be accomplished on the basis of a contact regime of reduced complexity, since merely one contact has to be provided for the shared capacitor electrode, while only one contact per capacitive structure is required for the other capacitor electrode.

In illustrative embodiments disclosed herein, a plurality of upper capacitor electrodes may be appropriately electrically connected with each other, for instance in the device level and/or the contact level and/or the metallization system, thereby forming a combined capacitive structure of increased capacitance, if considered appropriate for the overall device configuration. A corresponding electrical connection may, in some illustrative embodiments, be established on the basis of a corresponding design in a static manner, while, in other illustrative embodiments, a desired capacitor configuration and thus capacitance may be established in a dynamic manner, for instance by providing one or more appropriate switching elements, such as transistors, in order to establish the electrical connections in a dynamic and controlled manner. In other embodiments, the shared electrode of a plurality of capacitive structure may be electrically isolated from one or more other shared electrodes of other capacitive structures. In this case, a first plurality of capacitive structures may be connected in series with a second plurality of capacitive structures, which may be accomplished in a static or dynamic manner as described above. Hence, this concept may be used for voltage conversion and the like.

FIG. 1A schematically illustrates a top view of a semiconductor device 100, which may represent a semiconductor device including a plurality of active circuit elements, such as transistors and the like, in combination with a capacitive structure, which may serve as a buffer capacitor, a decoupling capacitor, a storage capacitor, a capacitor for RF applications and the like. The semiconductor device 100 may represent an SOI device in the sense that at least a portion of the active circuit elements, in particular the respective transistor elements, are formed on the basis of an SOI configuration, thereby providing the many advantages of SOI transistors compared to bulk transistors. In illustrative embodiments, the respective transistor elements to be formed in and on a first device region 100A may be provided in the form of fully depleted SOI transistor elements, i.e., as transistor elements in which the respective channel region may be substantially completely depleted. Such a configuration may be accomplished by providing low or no doping in the respective channel regions and selecting a reduced thickness of the semiconductor layer, for instance in the range of 10 nm and less.

The semiconductor device 100 may further comprise a second device region 100B, in which respective capacitive structures are to be formed, which will also be referred to herein as "buried" capacitive structures, since any capacitor electrodes as well as the capacitor dielectric material may be buried in the second device region 100B, thereby leaving a top surface of the second device region 100B available for other purposes, such as routing of conductive lines and the like, as will be described later on in more detail. In this manufacturing stage, the semiconductor device 100 may comprise a mask layer 106, such as a resist layer, a hard mask layer formed of any appropriate material or material composition and the like. The mask layer 106 may comprise respective mask openings 1006A, 106B, which may be appropriately dimensioned so as to form openings in the underlying materials on the basis of any appropriate material removal process, such as anisotropic etch techniques and the like. It should be appreciated that for convenience only two mask openings 106A, 106B are illustrated; however, any number of capacitive structures may be provided in the second device region 100B, depending on the overall design requirements.

FIG. 1B schematically illustrates a cross-sectional view of the semiconductor device 100 according to the section line indicated by A-A in FIG. 1A. As shown, the semiconductor device 100 may comprise a substrate material 101, which may be provided in the form of any appropriate semiconductor material, such as silicon, silicon/germanium, germanium and the like. It should be appreciated that the substrate material 101 may represent a material layer with a thickness of several hundred nanometers (nm) to several micrometers (μm), while, in other cases, the substrate material may also act as the carrier material for processing the semiconductor device 100 without providing any further carrier material.

Moreover, due to the SOI nature of the semiconductor device 100, a buried insulating layer 102 may be formed on the substrate material 101 with a thickness that is appropriate for the processing of the device 100, for instance in view of forming sophisticated transistor elements in and above the first device region 100A. For example, a thickness of the buried insulating layer 102 may range from approximately 10-50 nm and significantly greater, depending on the overall device requirements. The buried insulating layer 102 may comprise any appropriate insulating material, such as silicon dioxide, silicon nitride, silicon oxynitride and the like.

Moreover, the semiconductor device 100 may comprise a semiconductor layer 103, which, in an initial state, may contain any appropriate semiconductor materials, such as silicon, germanium, silicon/germanium or any other appropriate semiconductor material. In some illustrative embodiments, as discussed above, a thickness of the semiconductor layer 103 may be appropriately selected so as to comply with device requirements for fully depleted SOI transistor elements, which may require a thickness of approximately 10 nm and significantly less. Moreover, it should be appreciated that, in other device areas, the semiconductor layer 103 may have a different composition or the composition of the semiconductor layer 103 may be modified in a later manufacturing stage, for instance by replacing a portion of the semiconductor layer 103 by one or more other semiconductor components, such as silicon/germanium, in order to appropriately adapt the material characteristics of the channel regions of respective transistor elements to the performance requirements of the corresponding transistor elements.

The semiconductor device 100 may comprise sacrificial dielectric buffer layers 104, 105, which may formed of silicon dioxide, silicon nitride and the like. In particular, the layer 105 may be provided in the form of a silicon nitride material so as to act as a mask and protection layer for the further processing, also frequently referred to as a "pad nitride layer," which in conventional techniques may preferably be designed so as to act as a mask layer for forming shallow trench isolations, as will be explained later on in more detail. In one illustrative embodiment, a thickness 105T of the layer 105 is specifically adapted to the following processing for forming the buried capacitive structures, which may require an additional patterning process and subsequent material removal processes. Consequently, the initial thickness 105T of the layer 105 may be selected with an extra thickness of approximately 10-80 nm as compared to the conventional processing. It should be appreciated, however, that any appropriate initial thickness 105T may be effectively determined on the basis of experiments and the like, in which an expected material removal during the processing for forming the buried capacitive structure may be estimated. The respective estimated value may then be added to the well-established initial layer thickness of the nitride pad layer that corresponds to conventional process recipes.

Moreover, the semiconductor device 100 may comprise the mask layer 106, for instance as a resist material and the like, including the mask openings 106A and 106B, which substantially define the lateral dimensions of respective openings 101A and 101B to be formed so as to extend through the semiconductor layer 103 and the buried insulating layer 102 and into the substrate material 101.

The semiconductor device 100 as illustrated in FIGS. 1A and 1B may be formed on the basis of the following processes. An appropriate carrier substrate, for instance in the form of the substrate material 101, possibly in combination with additional materials, may be provided as an appropriate substrate, such as a semiconductor wafer, wherein the layers 102 and 103 may already be incorporated in the substrate or may be formed on the basis of well-established process techniques. Thereafter, the buffer layer 104, for instance comprising silicon dioxide and the like, and the buffer layer 105, for instance made of silicon nitride, may be formed on the basis of well-established techniques, such as oxidation, deposition and the like, wherein, as discussed above, in particular, the initial layer thickness 105T of the silicon nitride layer 105 is specifically adapted so as to accommodate the following process steps for forming the capacitive structures prior to forming respective trench isolation structures.

Thereafter, the mask layer 106 may be deposited, for instance, by any appropriate deposition technique, such as spin coating and the like, followed by a lithography process for patterning the mask layer 106 in order to form the mask openings 106A, 106B. It should be appreciated that the mask layer 106 may also comprise a hard mask material in addition or alternatively to a polymer material, if considered appropriate for the further processing. Next, an etch process, for instance a plasma assisted etch process, may be applied, for example, on the basis of similar etch recipes as are also conventionally employed for forming the trenches of a shallow trench isolation structure, thereby first etching through the layer 105 and using the layer 104 as an etch stop material. Thereafter, the etch process may be continued, for instance, by appropriately adjusting the etch chemistry so as to etch through the semiconductor layer 103 and also etching through the buried insulating layer 102 so as to finally expose a respective portion of the substrate material 101, thereby forming the openings 101A, 101B. It should be appreciated that, upon reliably exposing the respective portions of the substrate material 101 in the openings 101A, 101B, a certain amount of the substrate material 101 may be removed, wherein, however, a corresponding etch depth into the substrate material 101 may be restricted to approximately several hundred nanometers or less, for instance a hundred nanometers or less.

Figure 2B:
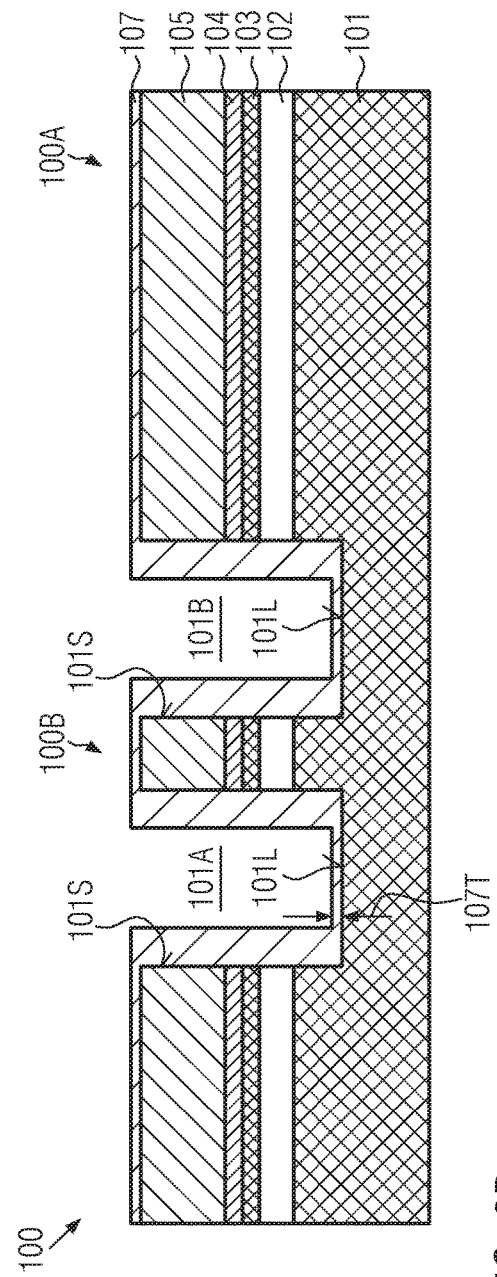

FIG. 2A schematically illustrates the semiconductor device 100 in a top view in a further advanced manufacturing stage. As illustrated, a spacer layer 107 is formed above the first and second device regions 100A, 100B and also within the openings 101A, 101B. The spacer layer 107 is formed with an appropriate thickness so as to reliably cover any surface portion and, in particular, sidewalls and a bottom face of the openings 1001A, 101B. To this end, any well-established deposition technique may be applied in order to form the spacer layer 107 of any appropriate dielectric material, such as silicon dioxide, silicon nitride, silicon oxynitride and the like.

FIG. 2B schematically illustrates a cross-sectional view of the semiconductor device 100 in a stage in which the spacer layer 107 is reduced in thickness, in particular at horizontal surface portions, in order to obtain a desired layer thickness at the bottom of the openings 100A, 100B. Thus, sidewalls 101S are covered by the material of the layer 107 with a thickness, i.e., a horizontal extension, that is significantly increased compared to a layer thickness 107T of the layer 107 formed at a central portion of a bottom face 101L of the openings 101A, 101B. To this end, the layer 107 may be deposited with an initial layer thickness so as to reliably cover any surface areas, for instance, with a thickness of approximately 20-200 nm, followed by an anisotropic etch process, similar to any etch techniques used for forming sidewall spacers of gate electrodes, wherein the etch process is appropriately controlled so as to obtain the desired thickness 107T at the bottom face 101L of the openings 101A, 101B. In a further illustrative embodiment, the deposition of the layer 107 may be accomplished on the basis of process parameters that are only selected in view of forming sidewall spacers to appropriately cover the sidewalls 101S, while completely removing the layer 107 from the bottom face 101L. In a further process, a further thin dielectric layer, for instance an oxide layer, may be deposited with the desired thickness 107T. In this manner, the desired thickness 107T of the dielectric layer 107 at the bottom face 101L may be established with superior precision.

It should be appreciated that a corresponding etch process, irrespective of whether a complete initial removal and subsequent re-deposition or a partial removal of the initial layer 107 is considered, may also include a wet chemical etch process, a cleaning process and the like, in particular at a final phase of the overall etch sequence, in order to precisely adjust the layer thickness 107T and/or any surface characteristics of the layer 107. It should be appreciated that the thickness 107T may be selected in compliance with device requirements of a capacitor to be formed on the basis of the substrate material positioned below the openings 101A, 101B and a further electrode to be formed in the openings 101A, 101B. For example, depending on the material characteristics of the layer 107, a thickness of approximately 1 nm to several nanometers may be selected. It should further be appreciated that the layer 107 may include two or more different materials in the form of different layers, if considered appropriate for the overall performance of the capacitive structure still to be formed.

Figure 3A:
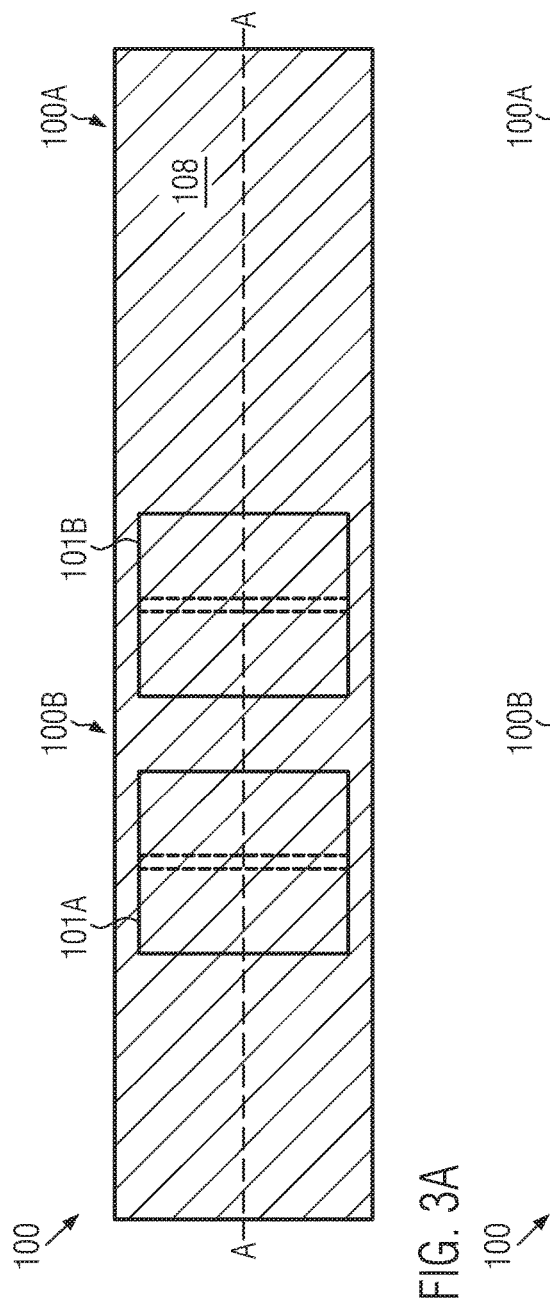
FIGS. 3A and 3B schematically illustrate a top view and a cross-sectional view, respectively, of the semiconductor device in a manufacturing stage, in which a metal material is provided for forming the metal-containing electrodes, according to illustrative embodiments.

FIG. 3A schematically illustrates the semiconductor device 100 in a further advanced manufacturing stage, in which a layer of conductive material, in some illustrative embodiments, a metal-containing material layer, in other illustrative embodiments a doped semiconductor material, is formed above the first and second device regions 100A, 100B, wherein, in particular, the openings 101A, 101B are substantially completely filled with the material of the layer 108. To this end, any appropriate deposition technique may be applied, such as CVD (chemical vapor deposition), PVD (physical vapor deposition), such as sputter techniques, and the like. In one illustrative embodiment, the layer 108 may include tungsten and may, in particular embodiments, be provided as a substantially pure tungsten layer. In other illustrative embodiments, the layer 108 may comprise doped polysilicon or may be provided as a doped polysilicon material.

Figure 3B:
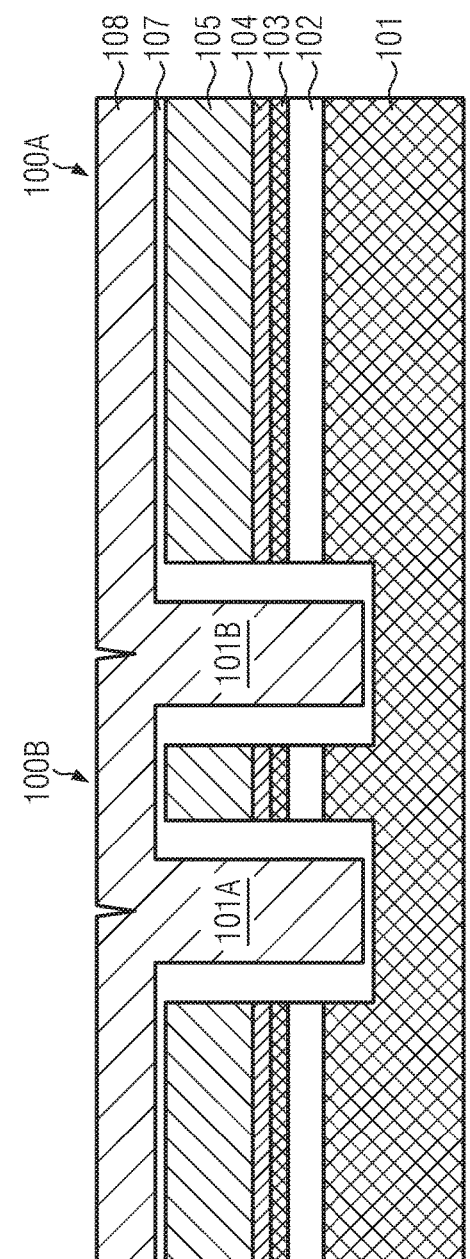

FIG. 3B schematically illustrates a cross-sectional view of the semiconductor device 100 of FIG. 3A. As illustrated in FIG. 3B, in some embodiments the conductive material layer 108 may overfill the openings 101A, 101B such that at least a portion of the layer 108 is formed above an upper surface of the layer 107 and outside of the openings 101A, 101B, while, in other embodiments (not shown), the openings 101A, 101B may only be partially filled by the material of the layer 108.

Figure 4A:
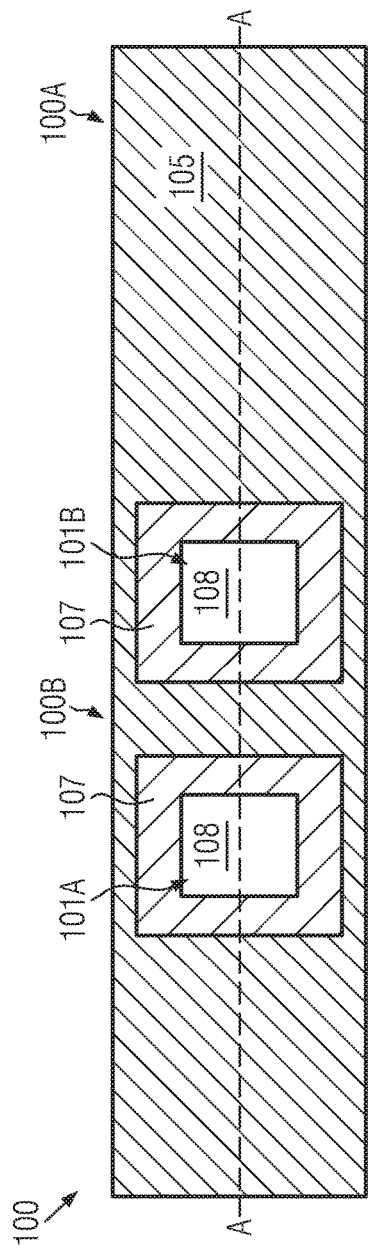
FIGS. 4A and 4B schematically illustrate a top view and a cross-sectional view, respectively, of the semiconductor device in a further advanced manufacturing stage, in which metal-containing capacitor electrodes are formed, according to illustrative embodiments.

FIG. 4A schematically illustrates a top view of the semiconductor device 100 in a further advanced manufacturing stage. As illustrated, the openings 101A, 101B are partially filled with the remainder of the material layer 108, wherein, for convenience, the material residues in the openings 101A, 101B are referred to as capacitor electrodes and are denoted by the same reference numerals 108. Moreover, as shown, the buffer layer 105 may be exposed in the first and second device regions 100A, 100B. Furthermore, the material layer 107 formed on sidewalls of the openings 101A, 101B may also be exposed.

Figure 4B:
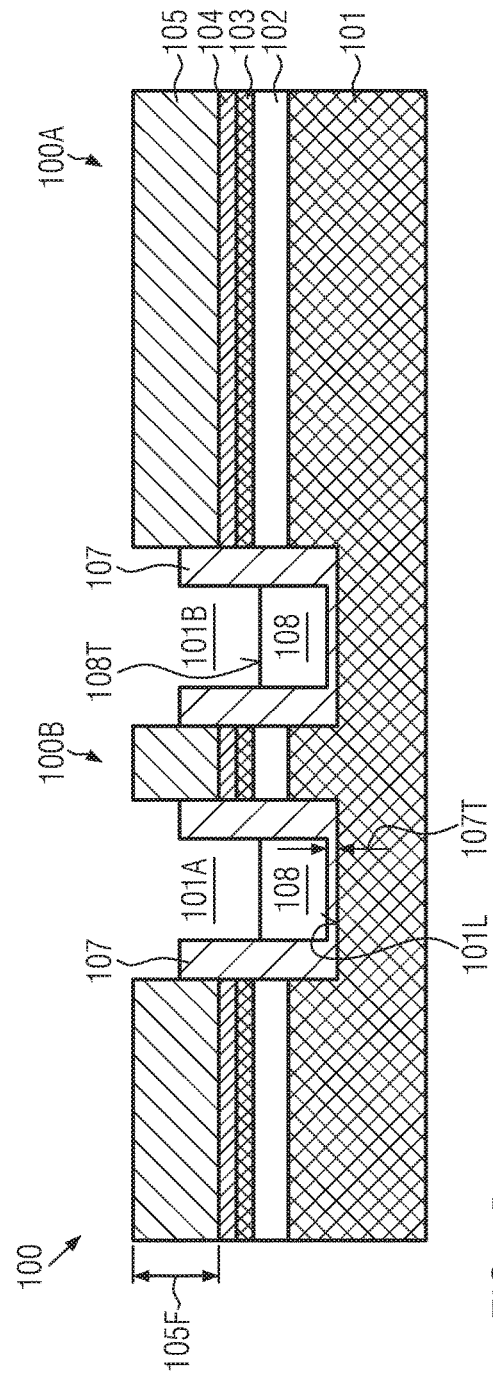

FIG. 4B schematically illustrates a cross-sectional view of the semiconductor device 100 in the manufacturing stage as also illustrated in FIG. 4A. Hence, the electrodes 108, in some illustrative embodiments in the form of metal-containing electrodes, such as tungsten-containing electrodes, are formed in the openings 101A, 101B and are laterally delineated by the dielectric material of the layer 107 still formed on sidewalls of the openings. Furthermore, the material of the layer 107 formed at the bottom face 101L and having the thickness 107T separates the respective electrodes 108 from the underlying substrate material 101, which will act as a shared electrode for the capacitive structures to be formed on the basis of the electrodes 108 and the dielectric material 107 having the thickness 107T formed in the respective openings 101A, 101B.

Starting from the configuration as shown in FIGS. 3A, 3B, the semiconductor device 100 as illustrated in FIGS. 4A, 4B may be formed by applying a planarization process, such as a chemical mechanical polishing (CMP) process based on appropriate process recipes so as to firstly planarize the resulting surface topography and, in some illustrative embodiments, finally exposing the buffer layer 105, which may therefore be used as a CMP stop layer. On the basis of a substantially thinned and planarized layer 108 (FIG. 3B) or on the basis of a substantially exposed buffer layer 105, the further processing may be continued by an etch process, in which the final thickness of the electrodes 108 may be adjusted within the openings 101A, 101B. To this end, plasma assisted and/or wet chemical etch recipes may be applied, followed by appropriate cleaning processes in accordance with well-established process techniques. It should be appreciated that, in particular during a final phase of the overall material removal, a portion of the exposed material 107 at the sidewalls of the openings 101A, 101B may be also removed, thereby also reliably removing any material residues of the layer 108 at the sidewalls, while the corresponding material removal at the surface of the buffer layer 105 may be significantly less. It should be appreciated that a total amount of material removal of the layer 105 may result in a final thickness 105F, which is still appropriate for the further processing of the semiconductor device 100, for instance with respect to forming shallow trench isolation structures, as will be discussed later on. As a consequence, the respective difference of the initial layer thickness 105T (FIG. 1B) and the final thickness 105F may have been taken into consideration by initially forming the layer 105 with its initial thickness in order to guarantee a reliable further processing on the basis of the final thickness 105F.

As a result, basically the structure of a plurality of capacitors may be provided in the form of the electrodes 108, the dielectric material 107 having the thickness 107T at the bottom face 101L of the openings 101A, 101B and the substrate material 101 connecting to the dielectric material 107 having the thickness 107T. As is evident, the resulting capacitive structures may be considered as buried capacitive structures, since a top surface 108T may be positioned at a height level that is at or below a height level defined by a bottom face of the semiconductor layer 103. In this respect, it is to be understood that the capacitive structures may be considered as device structures provided "at the level of the buried insulating layer 102" in the sense that at least the capacitor dielectric material, i.e., the material 107 having the thickness 107T at the bottom face 101L, may be positioned in the vicinity of the bottom face of the buried insulating layer 102. In this context, the term "in the vicinity" is to be understood as a distance of the bottom face 101L to the bottom face of the insulating layer 102 of approximately one micrometer or significantly less, preferably 500 nm and less, and more preferably of 100 nm and less. Furthermore, it should be appreciated that, although the lateral dimensions of the capacitive structures, i.e., of the openings 101A, 101B, may vary over a wide range, for instance approximately a hundred nanometers and significantly more, it may nevertheless be preferable to provide a plurality of such capacitive structures instead of one continuous capacitive structure with respect to process uniformity and the like. As will be explained later on in more detail, if required, at least some of the plurality of capacitive structures may be statically or dynamically electrically connected so as to adjust a desired total capacitance of a respective combined capacitive structure.

Figure 5A:
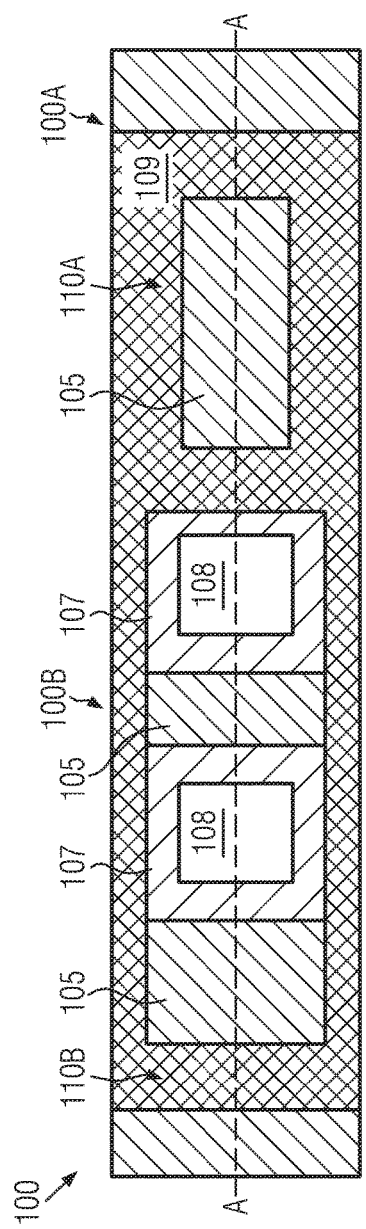
FIGS. 5A and 5B schematically illustrate a top view and a cross-sectional view, respectively, of the semiconductor device in a further advanced manufacturing stage, wherein isolation trenches are formed so as to delineate device regions for forming, on the one hand, transistor elements or other circuit elements and, on the other hand, capacitive structures, according to illustrative embodiments.

FIG. 5A schematically illustrates a top view of the semiconductor device 100 in a further advanced manufacturing stage. As illustrated, respective trenches 109 are formed so as to laterally enclose the first and second device regions 100A, 100B. That is, in the manufacturing stage shown, the buffer layer 105, the dielectric material 107 and the electrodes 108 may be exposed after the corresponding process technique for forming the trenches 109, which in turn laterally delineate the various device regions in the semiconductor device 100.

Figure 5B:
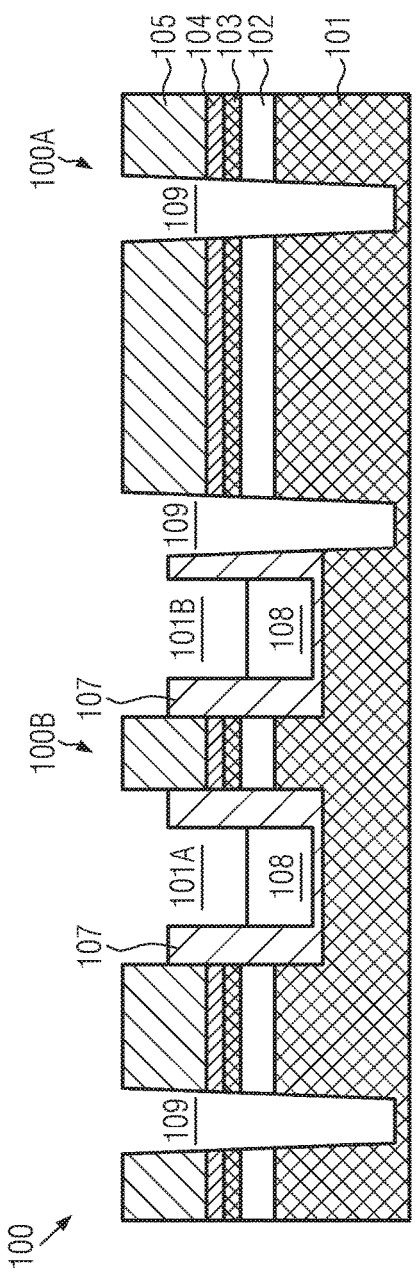

FIG. 5B schematically illustrates the device 100 in a cross-sectional view, wherein the trenches 109 are shown so as to extend through the buffer layers 105, 104, the semiconductor layer 103, the buried insulating layer 102 and into the substrate material 101, wherein a depth of the trenches 109 within the substrate material 101 is typically selected so as to comply with the overall device requirements. Moreover, in illustrative embodiments, as shown in FIGS. 5A, 5B, a depth of the trenches 109 may be greater compared to the depth of the openings 101A, 101B. In this case, the trenches 109 may also laterally delineate the area within the substrate material 101, which may act as a shared capacitor electrode and as a contact region for electrically connecting to the shared capacitor electrode, as will also be explained later on in more detail.

The trenches 109 may be formed on the basis of conventional process strategies, for instance, by performing a typical lithography process and providing an appropriate mask layer, which defines the lateral size and position of the trenches 109. Thereafter, an appropriate process sequence may be applied so as to firstly etch through the buffer layer 105, which may subsequently be used as an etch mask for further continuing the etch sequence and etch through the layers 104, 103 and 102 on the basis of well-established process recipes. Finally, the etch process may be continued so as to etch into the substrate material 101 in order to form the trenches 109 to a desired depth.

FIG. 6A schematically illustrates the semiconductor device 100 in a top view at a stage, after respective trench isolation structures 110A, 110B have been provided on the basis of the trenches 109 (FIG. 5B) in order to laterally delineate the first and second device regions 100A, 100B, respectively. Consequently, the trench isolation structures 110A, 110B may be formed laterally adjacent to the respective device regions and may include any appropriate dielectric material 110, which may, if considered appropriate, be composed of two or more different dielectric materials. For example, the dielectric material 110 may be substantially composed of silicon dioxide in deposited form, possibly in combination with areas formed by oxidation. Consequently, in this manufacturing stage, the surface of the semiconductor device 100 may be substantially composed of surface areas corresponding to the dielectric material 110 and exposed portions of the buffer layer 105.

FIG. 6B schematically illustrates the semiconductor device 100 in a cross-sectional view, thereby illustrating that the trench isolation structures 110A, 110B, which in illustrative embodiments may also represent as shallow trench isolation structures, may respectively delineate in the lateral directions, i.e., surround, the first device region 100A and the second device region 100B. In this respect, it should be appreciated that the first and second device regions 100A, 100B may share a specific component of the structures 110A, 110B, if the first and second device regions 100A, 100B are immediately adjacent to each other, as illustrated. In other cases, these device regions may be separated from each other depending on overall device design. Moreover, as shown, the capacitor electrode 108 may be covered by the dielectric material 110, which may therefore be of the same configuration or type as the dielectric material 110 in the isolation structures 110A, 110A. Consequently, a substantially planar surface topography is provided so as to enhance the further processing of the semiconductor device 100 substantially without being negatively affected by the presence of the capacitive structures in the second device region 100B. It should further be noted that the capacitor electrodes 108 are encapsulated by dielectric material, i.e., the dielectric material 107 and the dielectric material 110.

The semiconductor device 100 as illustrated in FIGS. 6A, 6B may be formed on the basis of the following process techniques. After having formed the trenches 109 (FIG. 5B), any appropriate dielectric material, such as silicon dioxide, may be deposited, possibly accompanied by an oxidation process, in order to reliably fill the trenches of the isolation structures 110A, 110B, thereby also forming a certain surface layer (not shown) of the dielectric material. Thereafter, a material removal may be performed, for instance, on the basis of well-established CMP recipes, thereby planarizing the overall surface topography and finally exposing layer portions of the layer 105. It should be appreciated that the corresponding process sequence may also include any final polishing processes as may be required for obtaining the necessary surface characteristics and the like. Consequently, in this manufacturing stage, well-established process techniques may be applied, thereby forming the isolation structures 110A, 110B and also reliably encapsulating the capacitor electrodes 108 by filling in the dielectric material 110. It should be appreciated that, during the corresponding process sequence, further material removal of the layer 105 may be caused, thereby further reducing the thickness of the layer 105, as indicated by a thickness 105S. It is to be noted, however, that the thickness 105S may substantially correspond to a remaining layer thickness as also encountered in conventional process techniques, since the buried nature of the capacitive structures in the second device region 100B may substantially not affect the overall process sequence for forming the isolation structures 110A, 110B.

Figure 7A:
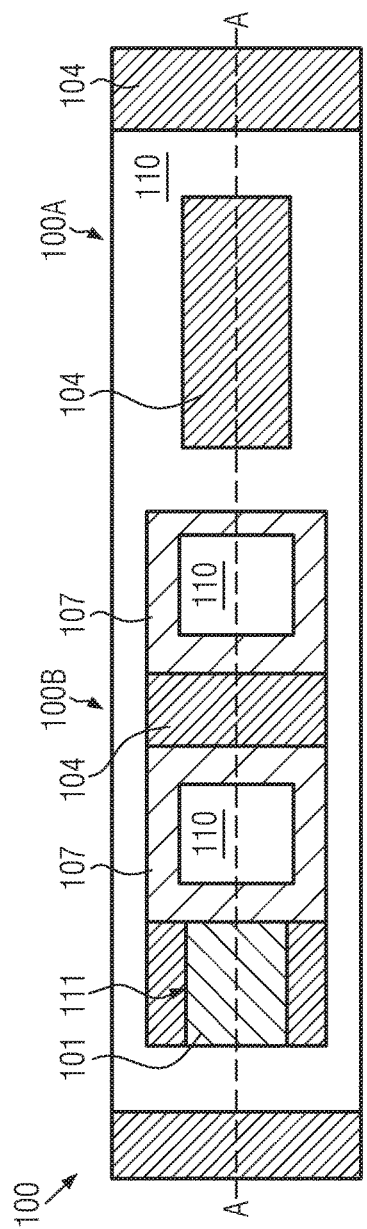
FIGS. 7A and 7B schematically illustrate a top view and a cross-sectional view, respectively, of the semiconductor device in a manufacturing stage, in which a recess is formed so as to connect to the substrate material in the second device region, according to illustrative embodiments.

FIG. 7A schematically illustrates a top view of the semiconductor device 100 after having performed a process sequence for providing the respective openings so as to connect to the substrate material 101. In the embodiment shown, a respective recess 111 may be formed in the second device region 100B so as to provide access to the substrate material 101, which may therefore enable to provide connection to this portion of the substrate material that acts as a shared capacitor electrode, as already discussed above. Moreover, the material layer 105 (see FIG. 6B) may have been removed, thereby exposing the layer 104 at the respective surface portions, as illustrated in FIG. 7A.

Figure 7B:
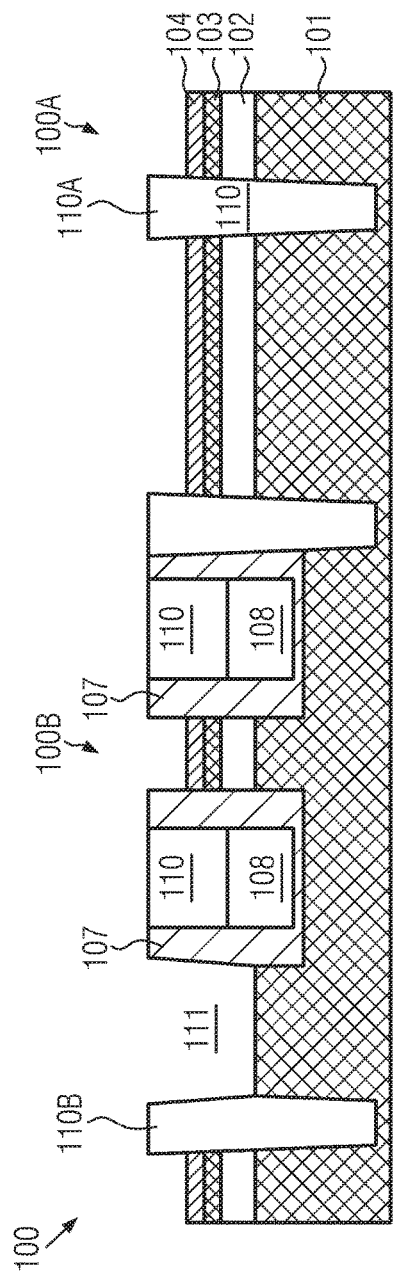

FIG. 7B schematically illustrates a cross-sectional view of the device 100, wherein, as discussed above, the recess 111 is formed so as to expose the respective portion of the substrate material 101 within the second device region 100B. Moreover, at the relevant surface areas, the layer 104, for instance in the form of silicon dioxide, may be exposed.

The device configuration as shown in FIGS. 7A, 7B may be obtained on the basis of the following process techniques. Based on the substantially planar surface topography as shown in FIGS. 6A, 6B, an appropriate mask layer, such as a resist layer and the like, may be formed in order to define the lateral position and size of the recess 111. It should be appreciated that any other recesses may be formed simultaneously in device regions, which also require the exposure and thus access to the substrate material 101. For example, one or more recesses for forming substrate contacts may be formed during the same process sequence. Prior to or after forming a respective mask layer, the remaining buffer layer 105 (see FIG. 6B) may be removed, thereby exposing the underlying buffer layer 104.

Thereafter, a respective etch process may be performed so as to etch through the layers 104, 103 and 102 by using well-established process recipes. Finally, the substrate material 101 may be exposed, thereby defining the bottom face of the recess 111. Thereafter, the corresponding mask layer may be removed. It should be appreciated that the resulting surface topography may correspond to the surface conditions as are also typically encountered in conventional semiconductor devices of similar design, in which respective buried capacitive structures are not provided. Consequently, the further processing may be continued on the basis of well-established process techniques in order to form circuit elements, such as transistors, which, in illustrative embodiments, are provided in the form of fully depleted transistors, as discussed above.

Figure 8A:
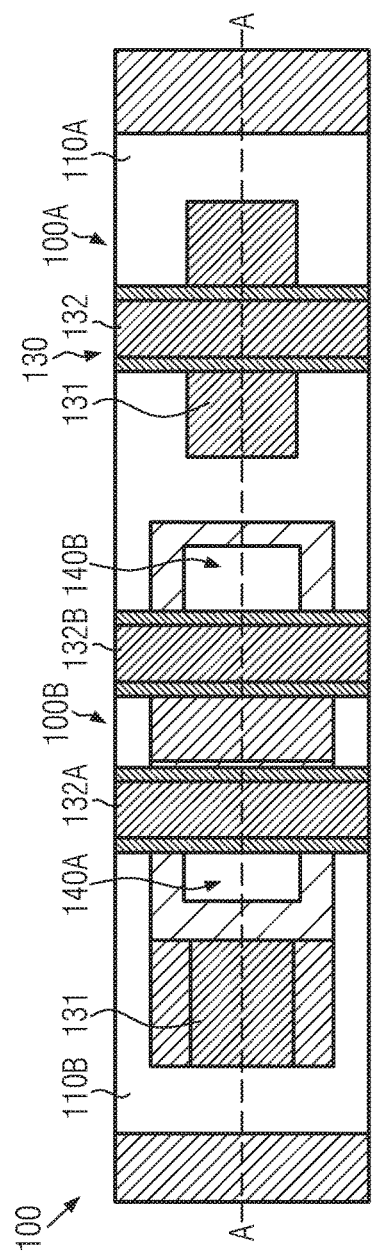
FIGS. 8A and 8B schematically illustrate a top view and a cross-sectional view, respectively, of the semiconductor device in a further advanced manufacturing stage, in which a transistor element and electrode lines are formed in and above the first and second device regions, respectively, according to illustrative embodiments.

FIG. 8A schematically illustrates a top view of the semiconductor device 100 after formation of circuit elements, such as transistors, in respective device regions. As shown, a plurality of transistor elements may be formed across the entire area of the semiconductor device 100, wherein, for convenience, only one transistor 130 is illustrated in the first device region 100A. The transistor 130 may represent any type of transistor element, such as a P-channel transistor or an N-channel transistor, wherein, as already discussed above, in one illustrative embodiment, the transistor 130 may represent a fully depleted transistor, which is to be understood as a transistor having a substantially charge carrier depleted channel region in the non-conductive transistor state. The transistor 130 may comprise a gate electrode structure 132 that complies with the overall design and device requirements of the device 100. In particular, a lateral dimension of the gate electrode structure 132 may comply with the overall design rules and, in sophisticated applications, may result in a gate length of 30 nm and less. Furthermore, respective metal-containing regions 131 of gate and drain areas of the transistor 130 may be provided.

In the second device region 100B, capacitive structures 140A, 140B may be provided on the basis of the components as previously discussed, wherein one or more conductive lines 132A, 132B may be formed, at least partially, above the buried capacitive structures 140A, 140B, thereby providing additional routing capabilities in the device level, i.e., in the level of the gate electrodes 132, of the semiconductor device 100. In illustrative embodiments, the conductive lines 132A, 132B may have basically the same configuration as the gate electrode structure 132, except for the lateral dimensions thereof.

Figure 8B:
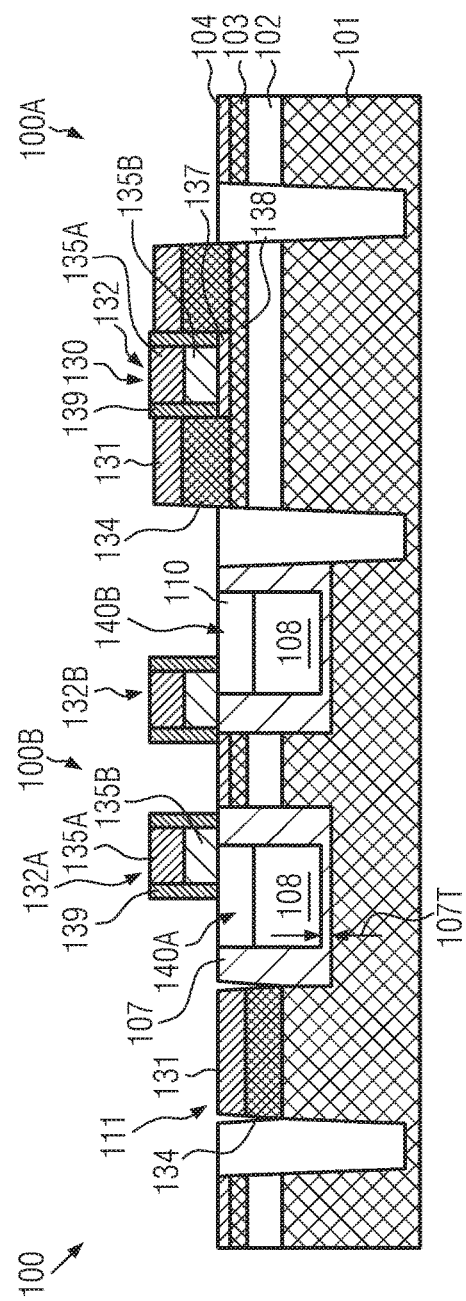

FIG. 8B schematically illustrates the semiconductor device 100 in cross-sectional view according to the section of line A-A of FIG. 8A. As illustrated, the transistor 130 may comprise the gate electrode structure 132, which in turn may include any appropriate gate electrode material, for instance a metal-containing material 135A in combination with a semiconductor-based material 135B. It should be appreciated, however, that, depending on the overall complexity of the gate electrode structure 132, the material 135B may also comprise metal-containing materials, as, for instance, used in highly sophisticated high-k metal-containing gate electrode structures. Moreover, the gate electrode structure 132 may comprise a gate dielectric material 137 that separates the conductive material of the gate electrode structure 132 from a channel region 138, which may substantially correspond to the material of the semiconductor layer 103, or which may comprise additional semiconductor components in order to comply with the overall requirements of the transistor 130. In particular, the channel region 138 may have a thickness based on the thickness of the initial layer 103 in the range of 10 nm and less, for instance 5 nm and less, if fully depleted transistors are considered. It should further be appreciated that the gate dielectric material 137 may comprise different materials, such as silicon oxynitride, silicon dioxide, silicon nitride, high-k dielectric materials and the like, depending on the overall device requirements. A high-k dielectric material is to be understood as a material having a dielectric constant k of 10 or greater.

Furthermore, the transistor 130 may comprise drain and source regions 134 in combination with a corresponding metal-containing material 131, wherein, in sophisticated applications, the drain and source regions 134 may be provided in the form of raised drain and source regions provided in the form of any appropriately doped semiconductor material that is epitaxially grown on the underlying material of the semiconductor layer 103. Furthermore, the gate electrode structure 132 may comprise a spacer structure 139 having any appropriate configuration.

In the second device region 100B, the buried capacitive structures 140A, 140B may be provided so as to comprise the capacitor electrodes 108 separated from the substrate material 101 by the dielectric material 107 having the thickness 107T that serves as the capacitor dielectric material. Furthermore, the capacitor electrodes 108 are encapsulated by the dielectric materials 107 and 110, as also previously discussed. Moreover, the recess 111 is filled with a highly doped semiconductor material, which, in illustrative embodiments, may have substantially the same configuration as the raised drain and source regions 134. Hence, the semiconductor material provided in the recess 111 is also denoted by the same reference sign 134. It is to be noted that the highly-doped semiconductor material 134 of the second device region 100B connects to the substrate material 101, while the semiconductor material 134 of the raised drain and source regions connects to the semiconductor layer 103. Similarly, a metal-containing region may be formed in and on the doped semiconductor material 134 of the second device region 100B, which may also have substantially the same configuration as the material 131 in the first semiconductor region 100A. Furthermore, a plurality of conductive lines 132A, 132B may be formed in the second device region 100B and may therefore at least partially be provided above the respective capacitive structures 140A, 140B. In illustrative embodiments, the conductive lines may represent electrode lines having the same configuration, except for the lateral dimensions thereof, as the gate electrode structure 132. Consequently, the electrode lines 132A, 132B may comprise the metal-containing material 135A, the further electrode material 135B and the sidewall spacer 139. It should be appreciated that also the gate dielectric material 137, although not shown in FIG. 8B in the context of the conductive lines 132A, 132B, may be provided below the respective electrode lines 132A, 132B.

Consequently, the space in the second device region 100B above the buried capacitive structures 140A, 140B may be efficiently used for providing the electrode lines 132A, 132B, thereby providing routing capabilities in the device level.

It should be appreciated that, in some illustrative embodiments, at least some of the buried capacitive structures 140A, 140B may be appropriately connected so as to obtain a combined capacitance, which may be accomplished by providing a respective device design in which, for instance, the electrodes 108 may be electrically connected, for instance, in the "buried" level by directly connecting the capacitor electrodes 108 during the formation of the respective openings and the partial filling of the corresponding openings. In other illustrative embodiments, the connection between some of the electrodes 108 may be established in the device level based on respective contacts, as will be discussed later on in more detail, in order to establish a desired parallel connection of a plurality of buried capacitive structures 140A, 140B. In still other illustrative embodiments, a dynamic adjustment of a desired capacitance may be established on the basis of an appropriately designed switching mechanism, which, for instance, may comprise a switching element, such as the transistor 130, wherein one or more connections between one or more buried capacitive structures 140A, 140B may be established by appropriately switching the transistor 130 into a conductive or a non-conductive state. A respective electrical connection of two or more of the capacitive structures 140A, 140B and the transistor 130 may be accomplished in the contact level in combination with the conductive electrode lines 132A, 132B and/or in a corresponding metallization level to be formed above a corresponding contact level.

In other illustrative embodiments (not shown), the shared electrode in the form of the substrate material 101 in the second device region may be electrically isolated from other shared electrodes of other device regions including further buried capacitive structures, which may be accomplished by providing respective doped regions, for instance, during the well doping processes. In this case, even a series connection of two or more device regions including respective buried capacitive structures, such as the structures 140A, 140B, may be established. Also, in this case, the connection may be implemented in a static or dynamic manner, that is, by a permanent connection or by a controllable connection based on a switching element, a fuse and the like.

The semiconductor device 100 as shown in FIGS. 8A, 8B may be formed in accordance with any well-established process techniques, which may be applied for forming the transistor 130 having a desired overall configuration. To this end, any required well doping processes may be performed, in order to define the various well regions for different types of transistors and the like. In particular, in some illustrative embodiments, a desired dopant profile (not shown) may be provided in the substrate material 101 of the second device region 100B and other device regions. Such dopant profiles may be used for efficiently connecting the substrate material 101 of the second device region 100B to the highly-doped semiconductor material 134 of the second device region in order to obtain a low-ohmic connection, if desired. Also, if required, the dopant profiles may enable an electrical isolation of the second device region 100B from other device regions, such as the first device region 100A or other second device regions, as also discussed above.

Thereafter, the gate electrode structure 132 may be formed by forming the dielectric material 137 and the one or more gate electrode materials 135B, which may be appropriately patterned on the basis of respective lithography and etch techniques. Furthermore, at any appropriate state of the gate patterning process, the sidewall spacers 139 may be formed. As discussed above, in illustrative embodiments, the electrode lines 132A, 132B may be formed concurrently so as to have basically the same configuration as the gate electrode structure 132. Thereafter, the drain and source regions 134 may be formed in the first device region 100A, while at the same time also forming the corresponding highly doped crystalline semiconductor material 134 in the recess 111 of the second device region 100B. Thereafter, respective anneal processes may be performed, if required, followed by the formation of the metal-containing regions 131, 135A, which may be accomplished on the basis of any appropriate metal species, such as nickel and the like, and respective process techniques, such as silicidation and the like. It should be appreciated that, except for a different overall device design in illustrative embodiments, no further alterations of the general process flow may be required for forming the transistor 130 and the electrode lines 132A, 132B.

Figure 9A:
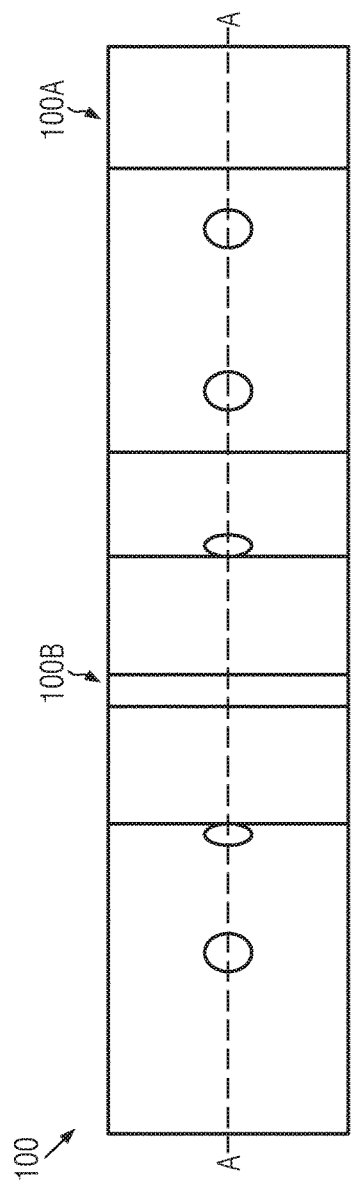
FIGS. 9A and 9B schematically illustrate a top view and a cross-sectional view, respectively, of the semiconductor device in a manufacturing stage, in which a contact level is provided so as to connect to the transistor element in the first device region and to the buried capacitive structures in the second device region, according to illustrative embodiments.

FIG. 9A schematic illustrates a top view of the semiconductor device 100 in a further advanced manufacturing stage. As illustrated, respective contact elements 155A are formed in an insulating material 151 of a contact level in the first device region 100A, while contact elements 155B, 155C are provided in the second device region 100B so as to connect to the underlying buried capacitive structures.

Figure 9B:
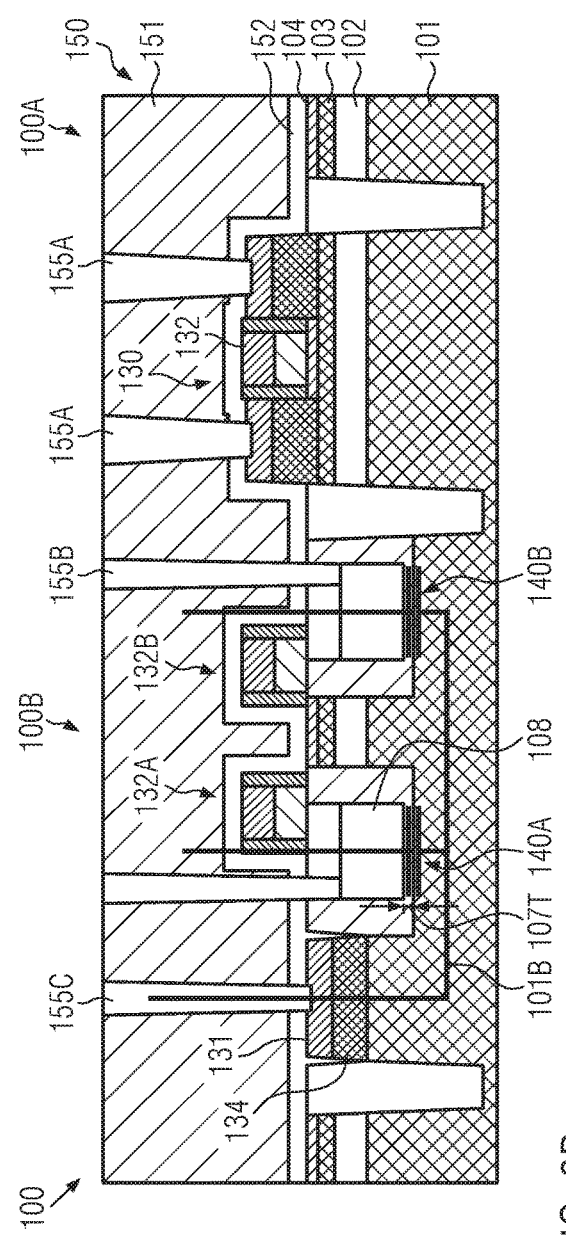

FIG. 9B schematically illustrates a cross-sectional view of the semiconductor device 100. As shown, a contact level 150 comprising a first dielectric layer 152, for instance in the form of a silicon nitride material and the like, and one or more second dielectric materials 151, such as silicon dioxide and the like, may be formed so as to cover and basically passivate the circuit elements in the form of transistors 130 and the like, and the electrode lines 132A, 132B. The contact elements 155A thus extend through the materials 151, 152 and connect to the drain and source regions of the transistor 130 and, if required, to the gate electrode structure 132 at any appropriate location in the semiconductor device 100. For convenience, any such contact elements connecting to the gate electrode structure 132 are not shown. Similarly, the contact elements 155B may connect to the buried capacitive structures 140A, 140B, respectively. More precisely, the contact elements 155B may connect to the respective capacitor electrodes 108, thereby enabling individual usage of the capacitive structures in accordance with the overall design requirements. On the other hand, the contact element 155C establishes a connection to the substrate material 101, which may represent a shared capacitor electrode, indicated as 101B, of the capacitive structures 140A, 140B. The contact element 155C connects to the shared capacitor electrode 101B via the metal-containing material 131 and the highly doped semiconductor material 134, as also explained above. It should further be appreciated that the substrate material 101 in the second device region 100B may have incorporated therein any appropriate dopant species so as to efficiently connect to the highly doped material 134, wherein any such doping species may have been incorporated at any appropriate manufacturing stage, for instance upon forming respective well regions in other parts of the semiconductor device 100, as discussed above. Moreover, as already discussed above, based on the contact elements formed in the contact level 150, two or more of the capacitive structures 140A, 140B may be connected in parallel so as to obtain a desired high capacitance, if required. In other cases, a switching element, such as the transistor 130, may be connected to the contact elements 155B of the capacitive structures 140A, 140B so as to enable controlled electrical connection of these capacitive structures upon switching the transistor 130 into the conductive state. Furthermore, a plurality of switching elements, such as the transistor 130, may be provided so as to enable the adjustment of a desired capacitance value in a dynamic manner if considered appropriate. In other cases, a plurality of first capacitive structures may be connected concurrently with the drain of the transistor 130, while a further plurality of capacitive structures may be connected with a source side of the transistor 130, thereby enabling a dynamic adjustment of capacitance upon appropriately controlling the transistor 130. It should be appreciated that a part of the routing of any such connections of a plurality of capacitive structures may be established on the basis of one or more of the electrode lines 132A, 132B, if considered appropriate. Consequently, any desired capacitance value may be established in a static manner by providing corresponding non-controllable permanent connections between the respective capacitive structures, and/or in a dynamic manner by providing at least one switching element, a fuse and the like, for controllably establishing a respective connection between one or more capacitive structures. As discussed above, a series connection may also be established, as long as the shared electrodes 101B of different second regions 100B may be held at different potentials, which may be accomplished by providing appropriate dopant profiles, as discussed above.

The device level 150 as shown in FIGS. 9A, 9B may be formed in accordance with well-established process techniques, for instance, by depositing the dielectric materials 152, 151 and planarizing the resulting surface topography. Thereafter, respective openings may be formed by well-established process strategies, wherein, in some illustrative embodiments, a common process sequence may be applied so as to form the openings for the contact elements 155A, 155B and 155C. It should be appreciated that a respective additional etch time required for etching through the dielectric material 110 formed above the capacitor electrode 108 may readily be taken into consideration during the entire etch sequence substantially without negatively affecting the respective openings for the contact elements 155A, 155C, since the metal regions 131 may act as efficient etch stop materials. Furthermore, the lateral size and shape of the contact elements 155B may be adjusted so as to allow a reliable contact of the capacitive structures 140A, 140B without negatively affecting the conductive lines 132A, 132B. For example, as shown in FIG. 9B, the lateral dimension of the contact elements 155B in the length direction of the transistor 130, i.e., in FIG. 9B the horizontal direction, may be appropriately reduced so as to avoid undue interference with the conductive lines 132A, 132B.

Thereafter, the further processing may be continued by forming one or more metallization levels on the contact level 150 in accordance with well-established process techniques. It should be appreciated that, except for providing the contact elements 155B, 155C, any space above the second device region 100B may still be available for forming respective metal lines so that, due to the buried nature of the capacitive structures 140A, 140B, a highly space-efficient design may be provided compared to conventional approaches for incorporating capacitors, as discussed above in the introductory part of this application.

As a result, the present disclosure provides semiconductor devices and manufacturing techniques in which buried capacitive structures may be provided at the level of the buried insulating layer of an SOI device, wherein, in illustrative embodiments, only one additional lithography and patterning process may be required for forming respective openings that accommodate one capacitor electrode, while the other capacitor electrode may be provided in the form of the substrate material as a shared capacitor electrode. Consequently, reduced process complexity is accomplished compared to conventional approaches, while still an encapsulated buried metal-containing capacitor electrode may be provided. Due to the incorporation of an insulating material at the top of the individual electrodes, which may have the same configuration as the insulating material of trench isolation structures, a substantially planar surface topography is obtained that basically corresponds to the surface conditions of conventional devices, thereby enabling the further processing on the basis of well-established process recipes. Since the capacitive structures may be provided as individual encapsulated capacitor electrodes in combination with a shared capacitor electrode, an efficient adaptation of the overall capacitance may be accomplished by statically or dynamically connecting respective encapsulated capacitor electrodes, thereby providing superior design efficiency and performance of the resulting semiconductor devices.

The particular embodiments disclosed above are illustrative only, as the subject matter defined by the appended claims may be modified and practiced in different but equivalent manners apparent to those skilled in the art having the benefit of the teachings herein. For example, some or all of the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the claimed subject matter. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of openings extending through a semiconductor layer, through a buried insulating layer, and into a substrate material in a second device region of a semiconductor device while covering a first device region of said semiconductor device;
    forming an insulating material on sidewalls and on a bottom face of each of said plurality of openings; and
    forming a first capacitor electrode in each of said plurality of openings in the presence of said insulating material, wherein each of said first capacitor electrodes comprises a conductive material and partially fills a respective one of said plurality of openings.

2. The method of claim 1, further comprising forming trench isolation structures extending through said semiconductor layer, through said buried insulating layer, and into said substrate material, said trench isolation structures laterally delineating and separating said first and second device regions.

3. The method of claim 2, wherein said trench isolation structures are formed after forming said first capacitor electrodes.

4. The method of claim 1, further comprising forming a recess in said second device region so as to expose said substrate material.

5. The method of claim 4, further comprising forming a contact element that is conductively coupled to said substrate material exposed by said recess in said second device region, said contact element providing an electrical connection to a second capacitor electrode formed in a portion of said substrate material below each of said first capacitor electrodes.

6. The method of claim 5, wherein said second capacitor electrode is a shared capacitor electrode of each of said first capacitor electrodes.

7. The method of claim 1, further comprising performing a common processing sequence to form a gate electrode of a transistor element above said first device region and a plurality of electrode lines above said second device region.

8. The method of claim 1, wherein forming said insulating material on said sidewalls and on said bottom face of each of said plurality of openings comprises:
    forming a layer of insulating material in each of said plurality of openings, a bottom portion of said layer of insulating material covering said bottom face of each of said plurality of openings; and
    reducing a thickness of said bottom portion of said layer of insulating material in each of said plurality of openings, said reduced thickness bottom portion covering said bottom face of each of said plurality of openings.

9. The method of claim 1, wherein forming said insulating material on said sidewalls and on said bottom face of each of said plurality of openings comprises:
    forming a first layer of insulating material in each of said plurality of openings, a bottom portion of said first layer of insulating material covering said bottom face of each of said plurality of openings;
    completely removing said bottom portion of said first layer of insulating material from each of said plurality of openings; and
    forming a second layer of insulating material in each of said plurality of openings, a bottom portion of said second layer of insulating material re-covering said bottom face of each of said plurality of openings.

10. The method of claim 1, wherein forming said first capacitor electrode in each of said plurality of openings comprises:
    forming a layer of said conductive material so as to overfill each of said plurality of openings;
    performing a planarization process to remove portions of said layer of said conductive material formed outside of said plurality of openings; and
    removing a portion of said conductive material from each of said plurality of openings by performing an etch process.

11. A method, comprising:
    forming a plurality of openings extending through a semiconductor layer, through a buried insulating layer, and into a substrate material in a second device region of a semiconductor device while covering a first device region of said semiconductor device;

forming an insulating material in each of said plurality of openings, said insulating material covering sidewalls and a bottom face of each of said plurality of openings;

forming a first capacitor electrode comprising a conductive material in each of said plurality of openings, said insulating material separating said first capacitor electrodes from said sidewalls and said bottom faces of said plurality of openings, wherein a height level of a top surface of each of said first capacitor electrodes is positioned at or below a height level of a bottom face of said semiconductor layer; and forming an electrical connection to a second capacitor electrode formed in a portion of said substrate material in said second device region below each of said first capacitor electrodes, wherein said second capacitor electrode is a shared capacitor electrode of each of said first capacitor electrodes.

12. The method of claim 11, wherein forming said electrical connection to said second capacitor electrode comprises:

forming a recess in said second device region so as to expose said substrate material; and forming a contact element that is conductively coupled to said substrate material exposed by said recess in said second device region.

13. The method of claim 11, further comprising forming trench isolation structures extending through said semiconductor layer, through said buried insulating layer, and into said substrate material, said trench isolation structures laterally delineating and separating said first and second device regions.

14. The method of claim 13, wherein said trench isolation structures are formed after forming said first capacitor electrodes.

15. The method of claim 11, further comprising performing a common processing sequence to form a gate electrode of a transistor element above said first device region and a plurality of electrode lines above said second device region.

16. The method of claim 11, wherein forming said insulating material in each of said plurality of openings comprises:

forming a layer of insulating material in each of said plurality of openings, a bottom portion of said layer of insulating material covering said bottom face of each of said plurality of openings; and reducing a thickness of said bottom portion of said layer of insulating material in each of said plurality of openings, said reduced thickness bottom portion covering said bottom face of each of said plurality of openings.

17. The method of claim 11, wherein forming said insulating material in each of said plurality of openings comprises:

forming a first layer of insulating material in each of said plurality of openings, a bottom portion of said first layer of insulating material covering said bottom face of each of said plurality of openings;

completely removing said bottom portion of said first layer of insulating material from each of said plurality of openings; and forming a second layer of insulating material in each of said plurality of openings, a bottom portion of said second layer of insulating material re-covering said bottom face of each of said plurality of openings.

18. The method of claim 11, wherein forming said first capacitor electrode in each of said plurality of openings comprises:

forming a layer of said conductive material in each of said plurality of openings; and performing an etch process to remove a portion of said conductive material from each of said plurality of openings.

19. The method of claim 11, wherein forming said first capacitor electrode in each of said plurality of openings comprises:

forming a layer of said conductive material above said second device region, said layer of conductive material overfilling each of said plurality of openings;

performing a planarization process to remove portions of said layer of said conductive material formed outside of said plurality of openings; and performing an etch process to remove a portion of said conductive material from each of said plurality of openings.

* * * * *